(12) United States Patent
Lin

(10) Patent No.: US 7,939,421 B2
(45) Date of Patent: May 10, 2011

(54) METHOD FOR FABRICATING INTEGRATED CIRCUIT STRUCTURES

(75) Inventor: Chiang Hung Lin, Danshuei Township (TW)

(73) Assignee: Nanya Technology Corp., Kueishan (TW)

( * ) Notice: Subject to any disclaimer, the term of this patent is extended or adjusted under 35 U.S.C. 154(b) by 0 days.

(21) Appl. No.: 12/499,622

(22) Filed: Jul. 8, 2009

(65) Prior Publication Data
US 2011/0008961 A1 Jan. 13, 2011

(51) Int. Cl.
*H01L 21/76* (2006.01)
*H01L 21/44* (2006.01)

(52) U.S. Cl. ............... 438/431; 438/597; 257/E21.251

(58) Field of Classification Search ............. 438/431, 438/255, 788, 694, 665, 398, 597; 257/E21.251, 257/E21.54, E21.013, E21.268, E21.647
See application file for complete search history.

(56) References Cited

U.S. PATENT DOCUMENTS

| | | | | |
|---|---|---|---|---|
| 6,444,542 | B2 * | 9/2002 | Moise et al. | 438/448 |
| 2005/0124113 | A1 * | 6/2005 | Yoneda | 438/255 |
| 2007/0269918 | A1 * | 11/2007 | Cho et al. | 438/32 |
| 2008/0026597 | A1 * | 1/2008 | Munro et al. | 438/788 |
| 2008/0254314 | A1 * | 10/2008 | Russell et al. | 428/640 |
| 2008/0263855 | A1 * | 10/2008 | Li et al. | 29/623.5 |
| 2009/0017596 | A1 * | 1/2009 | Hanson et al. | 438/431 |
| 2009/0040805 | A1 * | 2/2009 | Park et al. | 365/111 |
| 2010/0006976 | A1 * | 1/2010 | Kume et al. | 257/516 |

FOREIGN PATENT DOCUMENTS

| | | |
|---|---|---|
| JP | 2004-119754 A | 4/2004 |
| JP | 2008-091835 A | 4/2008 |

* cited by examiner

*Primary Examiner* — Walter L Lindsay, Jr.
(74) *Attorney, Agent, or Firm* — Hamre, Schumann, Mueller & Larson, P.C.

(57) ABSTRACT

A method for fabricating an integrated circuit structure includes the steps of forming a second dielectric layer on a substrate including a first conductive layer and a first dielectric layer, forming the second dielectric layer on the first conductive layer and the first dielectric layer, forming a hole exposing the first conductive layer in the second dielectric layer, forming a barrier layer inside the hole, and forming a second conductive layer on the barrier layer. In one embodiment of the present invention, the forming of the barrier layer comprises the steps of forming a metal layer in the hole, and performing a treating process in an atmosphere including a plasma formed from a gas including oxidant to form a metal oxide layer on the metal layer. In another embodiment of the present invention, the forming of the barrier layer comprises the steps of forming a metal nitride layer in the hole, and performing a treating process in an atmosphere including a plasma formed from a gas including oxidant to form a metal oxide layer on the metal and metal nitride layer.

19 Claims, 8 Drawing Sheets

METHOD FOR FABRICATING INTEGRATED CIRCUIT STRUCTURES

BACKGROUND OF THE INVENTION (A) Field of the Invention

The present invention relates to a method for fabricating an integrated circuit structure, and more particularly, to a method for fabricating an integrated circuit structure with a barrier layer by using a plasma enhanced treating process in an oxidant-containing atmosphere.

(B) Description of the Related Art

In the fabrication of integrated circuit structures, aluminum (Al) and its alloys are widely used for forming electrical connections. However, as device scale continues to be reduced, the number of devices which must be electrically interconnected has increased. The increased number of electrical interconnections required for advanced integrated circuit designs necessitates the formation of extremely narrow interconnect leads. The utilization of aluminum and its alloys for high density interconnect formation is limited by the tendency of aluminum to exhibit thermally induced voiding and electromigration. An additional problem of importance associated with aluminum metallurgy is the relatively higher electrical resistance of aluminum alloys compared to other electrically conductive metals.

To overcome the limitations associated with the use of aluminum for electrical interconnects, other metals such as copper (Cu), gold (Au), and silver (Ag) have been proposed as substitutes for aluminum and its alloys. Copper offers a desirable alternative to aluminum, because of its low resistivity. However, copper diffuses readily in materials commonly used in integrated circuit fabrication, such as silicon (Si) and silicon dioxide ($SiO_2$). This characteristic of copper prohibits the relatively straightforward formation of copper leads in a manner analogous to that used in the formation of aluminum interconnects. Therefore, the implementation of aluminum for the formation of electrical interconnects between aluminum and copper requires that special processes and materials be provided to overcome the problems of diffusion and adhesion associated with the use of copper.

SUMMARY OF THE INVENTION

One aspect of the present invention provides a method for fabricating a barrier layer by using a plasma enhanced treating in an oxidant-containing atmosphere to provide effective barrier ability to the copper diffusion. A method for fabricating a barrier layer according to this aspect of the present invention comprises the steps of forming a metal layer on a substrate, and performing a treating process in an atmosphere including a plasma formed from a gas including oxidant to form a metal oxide layer on the metal layer.

Another aspect of the present invention provides a method for fabricating a barrier layer by using a plasma enhanced treating in an oxidant-containing atmosphere to provide effective barrier ability to the copper diffusion. A method for fabricating a barrier layer according to this aspect of the present invention comprises the steps of forming a metal and metal nitride layers on a substrate, and performing a treating process in an atmosphere including a plasma formed from a gas including oxidant to form metal oxide layers on the metal and metal nitride layers.

Another aspect of the present invention provides a method for fabricating an integrated circuit structure with a barrier layer by using a plasma enhanced treating process in an oxidant-containing atmosphere. A method for fabricating an integrated circuit structure according to this aspect of the present invention comprises the steps of forming a first dielectric layer on a substrate including a first conductive layer, forming a second dielectric layer on the first conductive layer, forming a hole exposing the first conductive layer in the second dielectric layer, forming a barrier layer inside the hole, and forming a second conductive layer on the barrier layer. In one embodiment of the present invention, the forming of the barrier layer comprises the steps of forming a metal layer in the hole, and performing a treating process in an atmosphere including a plasma formed from a gas including oxidant to form a metal oxide layer on the metal layer. In another embodiment of the present invention, the forming of the barrier layer comprises the steps of forming a metal and metal nitride layers in the hole, and performing a treating process in an atmosphere including a plasma formed from a gas including oxidant to form metal oxide layers on the metal and metal nitride layers.

The foregoing has outlined rather broadly the features of the present invention in order that the detailed description of the invention that follows may be better understood. Additional features of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives of the present invention will become apparent upon reading the following description and upon reference to the accompanying drawings in which.

DETAILED DESCRIPTION OF THE INVENTION

Figure 1:
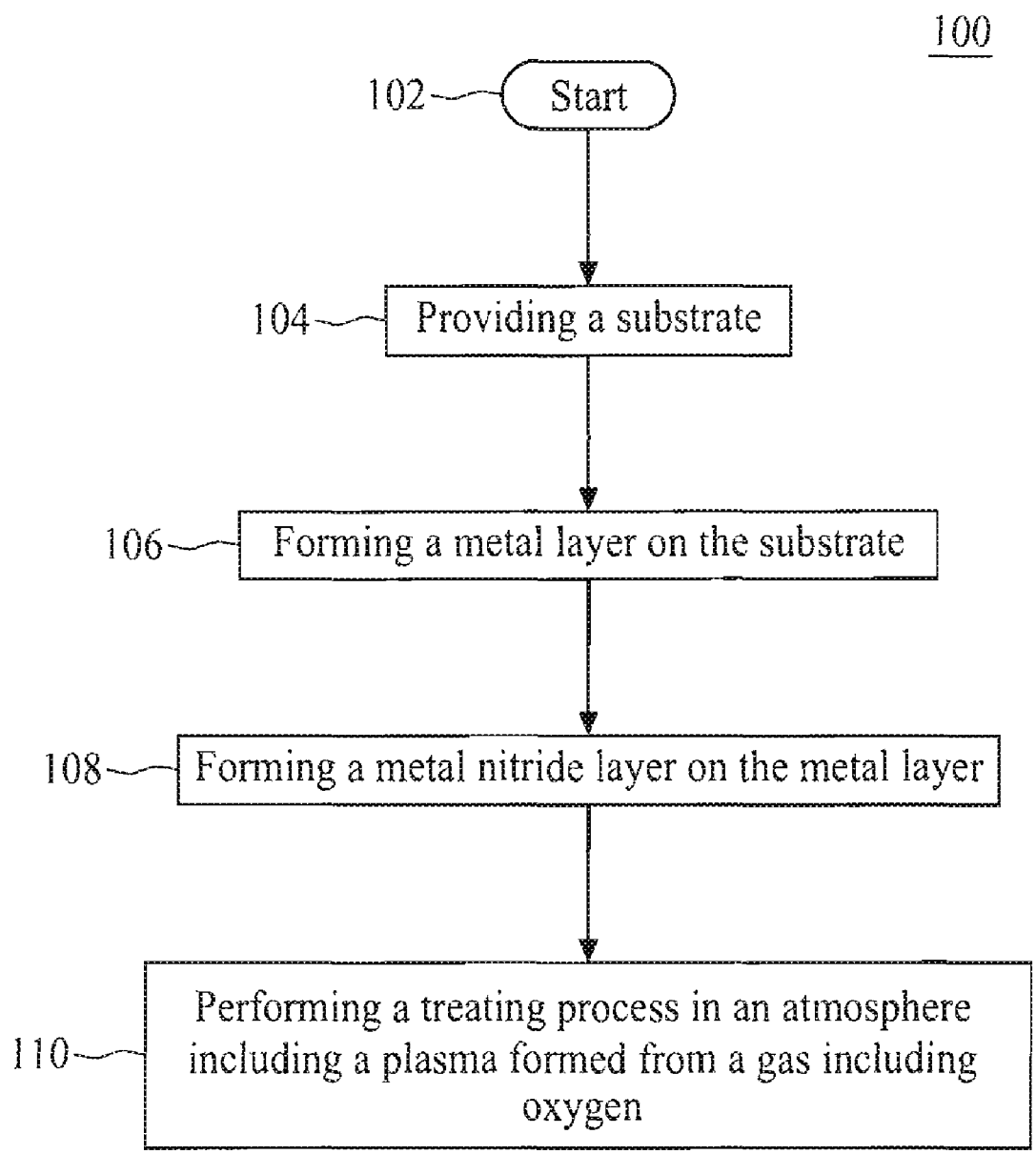
FIG. 1 is a flow diagram illustrating a method for fabricating a barrier layer of an integrated circuit structure according to one embodiment of the present invention.

FIG. 1 is a flow diagram illustrating a method 100 for fabricating a barrier layer of an integrated circuit structure according to one embodiment of the present invention. The method 100 includes processing steps performed upon a substrate such as silicon wafer during fabrication of the integrated circuit structure. In some embodiments, these processing steps are performed in the depicted order. In alternate embodiments, at least two of these steps may be performed simultaneously or in a different order. For example, step 108 and step 110 can be performed in a reversed order, i.e., performing step 110 before step 108. Sub-steps and auxiliary procedures (e.g., substrate transfers between processing reactors, process control steps, and the like) are well known in the art and, as such, are omitted herein. At least portions of the method 100 may be performed using processing reactors of an integrated semiconductor substrate processing system. One such processing system is the ENDURA. integrated processing system, available from Applied Materials, Inc. A general description of a suitable processing system 120 is discussed below with reference to FIG. 7.

Figure 2:
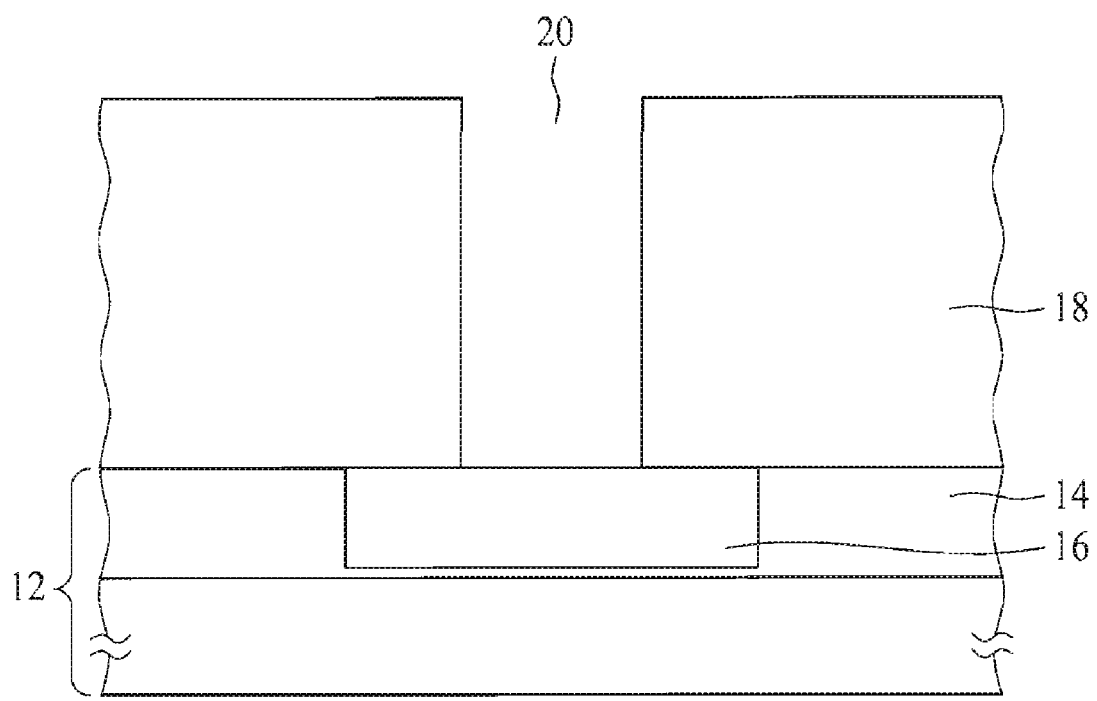
FIG. 2 and FIG. 3 illustrate a method for fabricating an integrated circuit structure according to one embodiment of the present invention.
Figure 3:
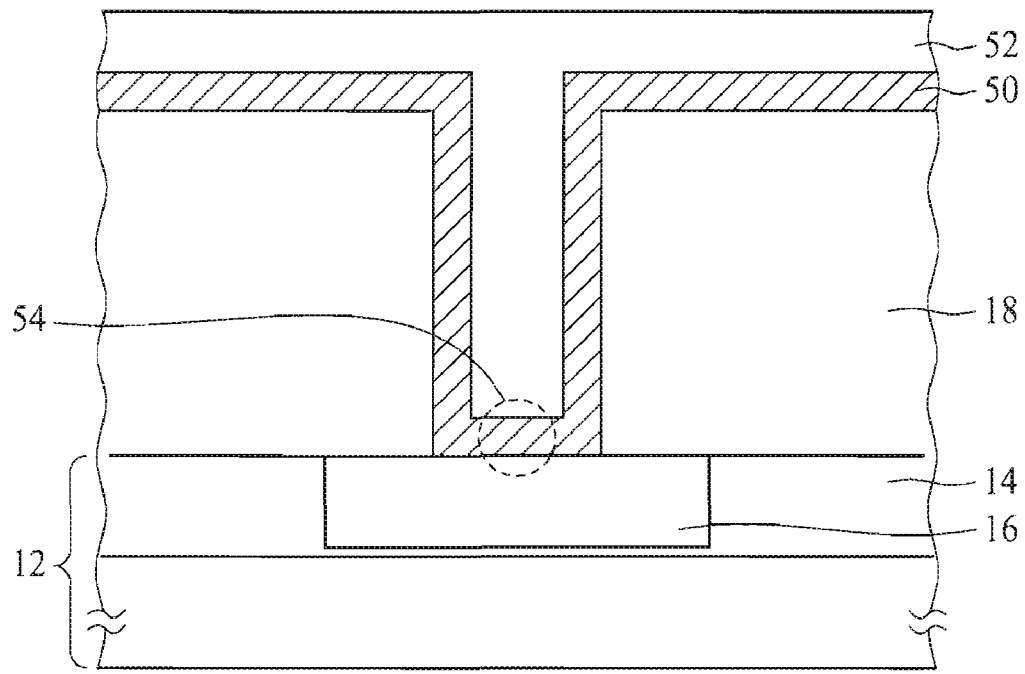

FIG. 2 and FIG. 3 illustrate a method for fabricating an integrated circuit structure 10 according to one embodiment of the present invention. A second dielectric layer 18 is formed on a substrate 12 including a first conductive layer 16 such as a copper layer in a first dielectric layer 14, and a hole 20 exposing the first conductive layer 16 is then formed in the second dielectric layer 18 by the photolithographic and etching processes. The substrate 12 may further include a silicon substrate, conductor and insulator below the first dielectric layer 14, which are prepared in advance of the forming of the first conductive layer 16. Subsequently, a barrier layer 50 is formed inside the hole 20 and on the second dielectric layer 18, and a second conductive layer 52 such as an aluminum layer is formed on the barrier layer 50, as shown in FIG. 3. The barrier layer 50 covers the bottom surface and the sidewall of the hole 20 to prevent the reciprocal diffusion of copper atoms in the first conductive layer 16 and aluminum atoms in the second conductive layer 52.

Figure 4:
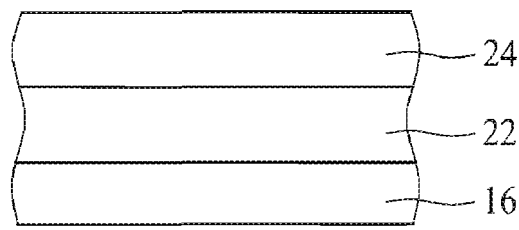
FIG. 4 to FIG. 6 illustrate a method for fabricating a barrier layer according to one embodiment of the present invention.
Figure 5:
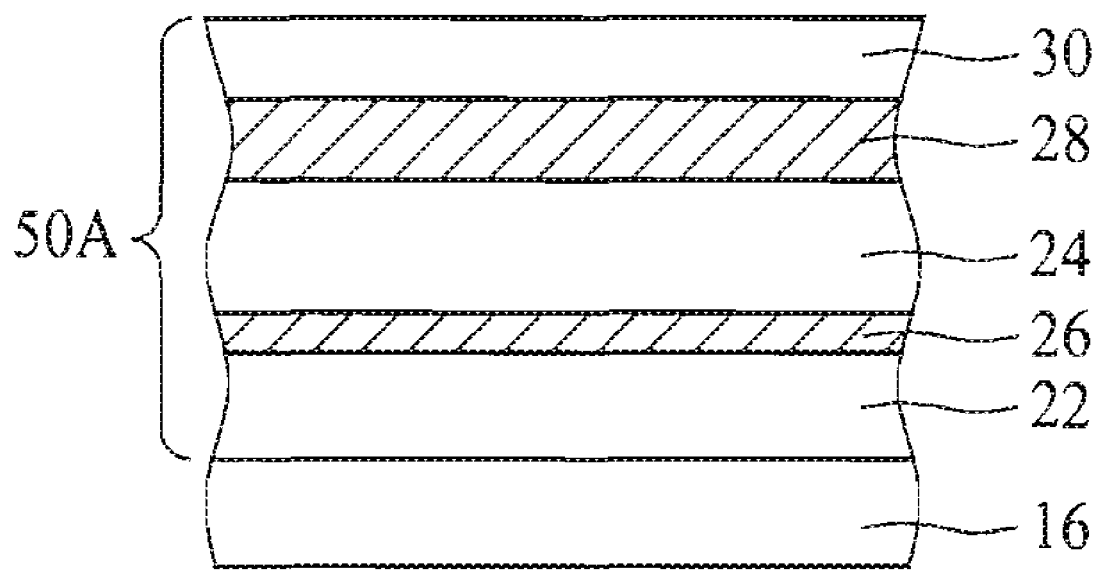
Figure 6:
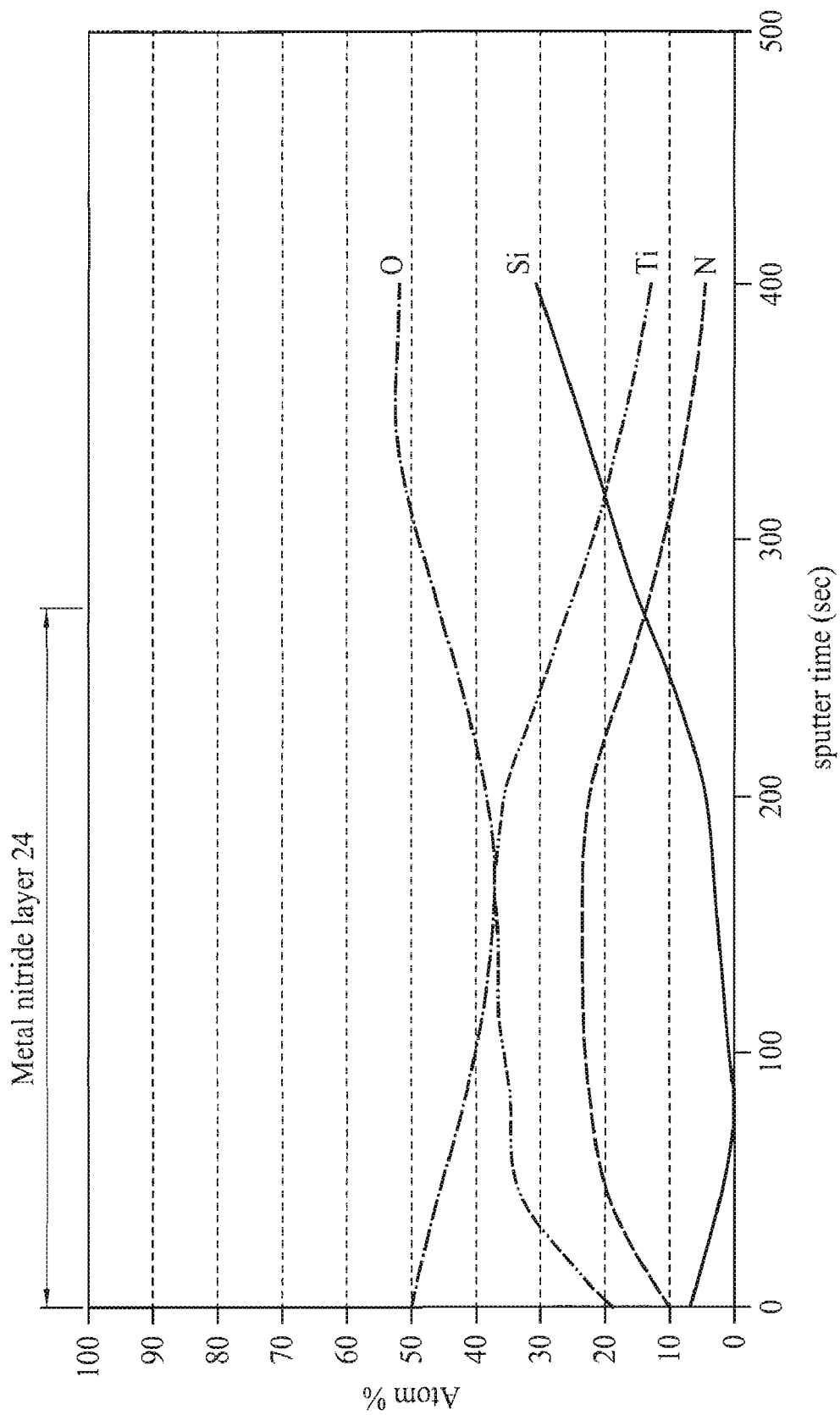

FIG. 4 to FIG. 6 illustrate a method for fabricating a barrier layer 50A according to one embodiment of the present invention, wherein FIG. 4 and FIG. 5 can be considered as close-up views of a selected portion 54 in FIG. 3. Referring to FIG. 4, after the hole 20 is formed in the second dielectric layer 18, a first metal layer 22 is formed in the hole 20, and a metal nitride layer 24 is then formed on the first metal layer 22. In one embodiment of the present invention, the first metal layer 22 is a titanium (Ti) layer or a tantalum (Ta) layer formed on the first conductive layer 16 by the physical vapor deposition such as the sputtering process, and the metal nitride layer 24 is a titanium nitride (TiN) layer or a tantalum nitride (TaN) layer formed on the first metal layer 22 by the physical vapor deposition such as the reactive sputtering process.

Referring to FIG. 5, a treating process is performed in an atmosphere including a plasma formed from a gas including oxygen ($O_2$) to form a first metal oxide layer 26 on the first metal layer 22. The treating process can be considered as an annealing process. In addition, the treating process also forms a second metal oxide layer 28 on the metal nitride layer 24. In one embodiment of the present invention, the first metal oxide layer 26 and the second metal oxide layer 28 are titanium oxide (TiO) or tantalum oxide (TaO) layers. Subsequently, a second metal layer 30 is formed on the second metal oxide layer 28 after the treating process. In one embodiment of the present invention, the second metal layer 30 is a titanium layer or a tantalum layer formed on the second metal oxide layer 28 by the physical vapor deposition such as the sputtering process.

In one embodiment of the present invention, the treating process comprises the steps of placing the substrate 12 with both the first metal layer 22 and the metal nitride layer 24 thereon in a reaction chamber, transferring the gas into the reaction chamber, and applying RF energy to the reaction chamber to perform a plasma enhanced oxidation process. The plasma is created by subjecting the gas to the RF energy between 1000 and 2000 Watt such that oxygen is ionized. Ionized oxygen possesses higher oxidation ability. If not subjected to the RF energy, oxygen will not be ionized until the temperature is higher than 270° C., and such high temperatures would increase the diffusion ability of copper in the first conductive layer 16. In contrast, by subjecting the oxygen to the RF energy, the treating process can be performed at lower temperatures, at least below 100° C. and even as low as room temperature.

FIG. 6 illustrates a profiling diagram of the barrier layer 50A after the treating process. Before the treating process, the metal nitride layer 24 has a column grain structure, which provides diffusion paths for copper atoms in the first conductive layer 16 through the grain boundary. It can be observed in FIG. 5 that oxygen atoms exist in the metal nitride layer 24, i.e., the metal nitride layer 24 with column grain structure is oxidized during the treating process. In other words, the grain boundary of the column grain structure in the metal nitride layer 24 is stuffed up by the oxygen atoms, and the barrier ability of the barrier layer 50A to the reciprocal diffusion of copper in the first conductive layer 16 and aluminum in the second conductive layer 52 is increased by the treating process.

In addition to stuffing up the grain boundary of the column grain structure in the metal nitride layer 24, the treating process also forms the first metal oxide layer 26 on the first metal layer 22. The first metal oxide layer 26 does not have the grain boundary because it is not column structure, i.e., it is able to effectively prevent the reciprocal diffusion of copper in the first conductive layer 16 and aluminum in the second conductive layer 52. Consequently, step 110 of treating process can be performed before step 108 of forming the metal nitride layer 24 in FIG. 1 since performing the treating process forms the first metal oxide layer 26 on the first metal layer 22, which can prevent the reciprocal diffusion of copper in the first conductive layer 16 and aluminum in the second conductive layer 52.

Figure 7:
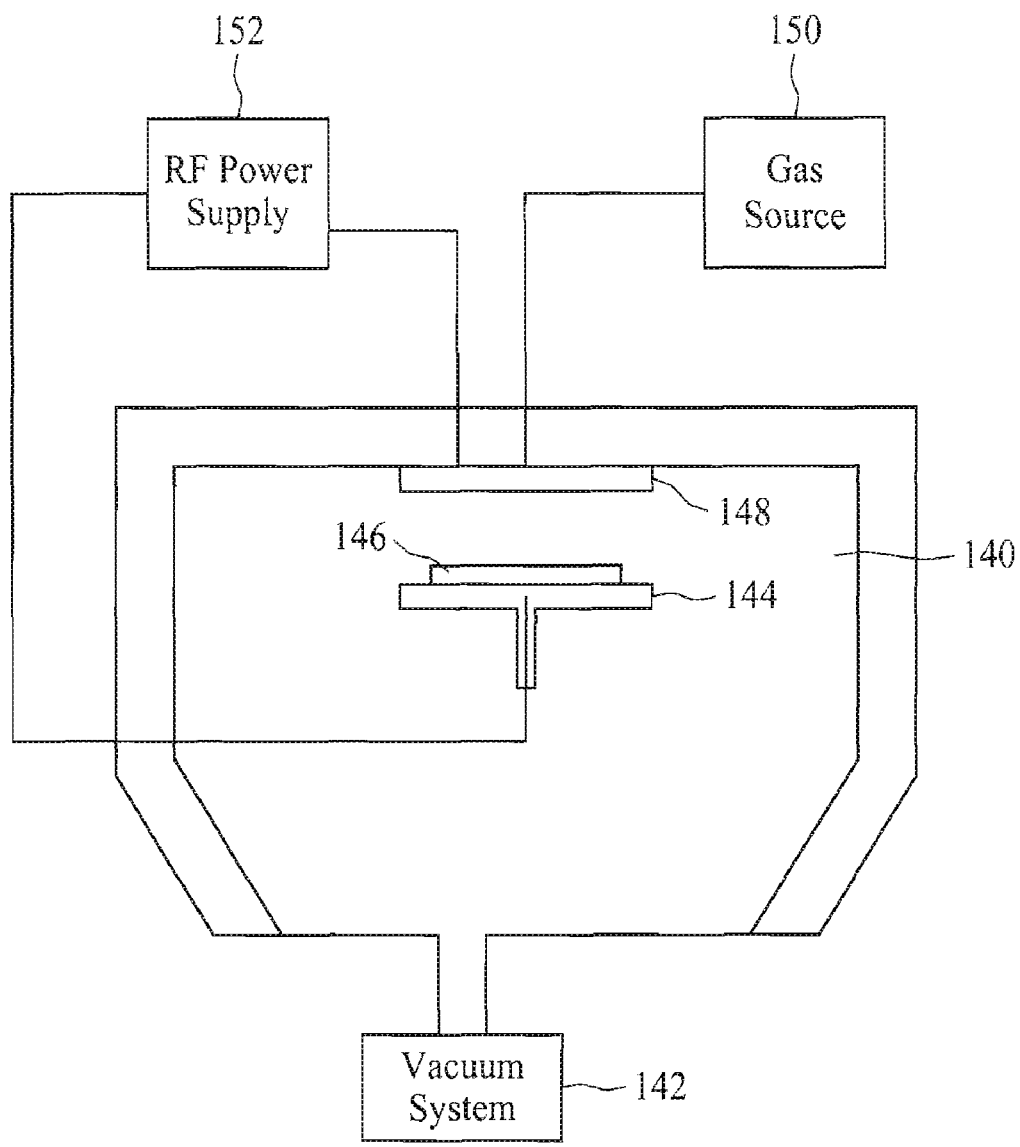
FIG. 7 depicts a schematic diagram of a plasma oxidation reactor.

FIG. 7 depicts a schematic diagram of a plasma oxidation reactor, which may be used to practice portions of the method 100 of FIG. 1. The particular embodiment of the system 120 is illustrative only and should not be used to limit the scope of the invention. It should be understood that the method 100 may be practiced using other processing systems and/or processing reactors.

Referring to FIG. 7, the plasma oxidation reactor 120 has a processing chamber 140 that is generally under a vacuum provided by the vacuum system 142. The processing chamber 140 is equipped with a pedestal 144 that holds a substrate 146 to be processed. The pedestal 144 has an electrode (not shown) embedded therein. A showerhead 148 is located over the pedestal 144. The showerhead 148 has a gas inlet electrode (not shown), and the showerhead 148 allows source gases from the gas source 150 to enter the processing chamber 140. Thus, the showerhead 148 facilitates the formation of a plasma from the source gases over the pedestal 144. An RF power supply 152 is coupled to the showerhead 148 via the gas inlet electrode and the pedestal 144 via the electrode in the pedestal. The plasma oxidation process may be carried out at a power of between approximately 1000 and 2000 Watt and the processing chamber 140 may be under a pressure of between approximately 5 and 20 mTorr.

Figure 8:
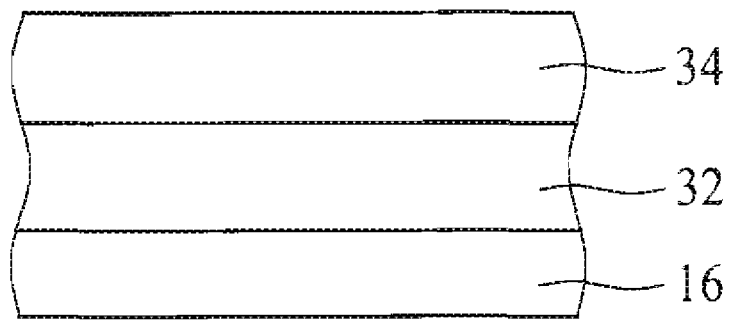
FIG. 8 to FIG. 10 illustrate a method for fabricating a barrier layer according to one embodiment of the present invention.
Figure 9:
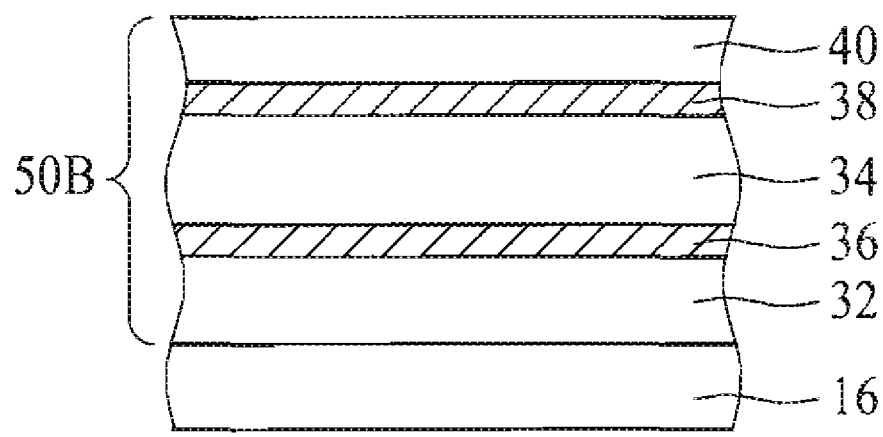
Figure 10:
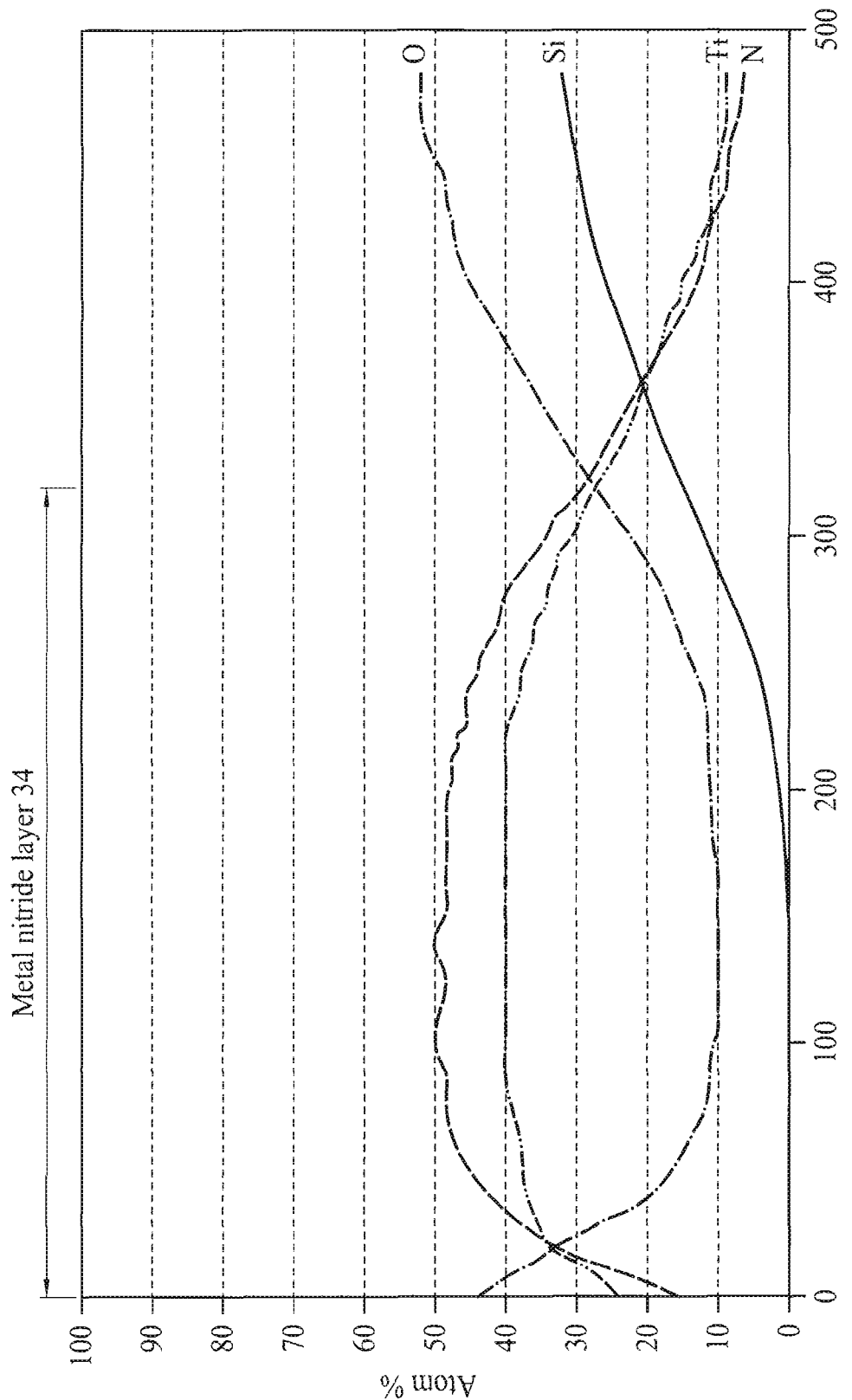

FIG. 8 to FIG. 10 illustrate a method for fabricating a barrier layer 50B according to one embodiment of the present invention, wherein FIG. 8 and FIG. 9 can be considered as close-up views of selected portion 54 in FIG. 3. Referring to FIG. 8, after the hole 20 is formed in the second dielectric layer 18, a first metal layer 32 is formed in the hole 20 and on the second dielectric layer 18, and a metal nitride layer 34 is then formed on the first metal layer 32. In one embodiment of the present invention, the first metal layer 32 is a titanium layer or a tantalum layer formed on the first conductive layer 16 by the sputtering process, and the metal nitride layer 34 is a titanium nitride layer or a tantalum nitride layer formed on the first metal layer 32 by the sputtering process.

Referring to FIG. 9, a treating process is performed in an atmosphere including a plasma formed from a gas to form a first metal oxide layer 36 between the first metal layer 32 and the metal nitride layer 34. In addition, the treating process also forms a second metal oxide layer 38 on the metal nitride layer 34. The gas may include oxygen and a reductant such as hydrogen ($H_2$). Preferably, the flow of hydrogen and oxygen is between 200 and 600 sccm, and the flow ratio of hydrogen is between 60 and 90%. In one embodiment of the present invention, the first metal oxide layer 36 and the second metal oxide layer 38 are titanium oxide or tantalum oxide layers. Subsequently, a second metal layer 40 is formed on the second metal oxide layer 38 after the treating process. In one embodiment of the present invention, the second metal layer 40 is a titanium layer or a tantalum layer formed on the second metal oxide layer 38 by the sputtering process.

In one embodiment of the present invention, the treating process comprises the steps of placing the substrate with the first metal layer 32 and the metal nitride layer 34 thereon in a reaction chamber, transferring the gas into the reaction chamber, and applying RF energy to the reaction chamber to perform a plasma oxidation process. The plasma is created by subjecting the gas to the RF energy between 1000 and 2000 Watt such that oxygen and hydrogen are ionized. If not subjected to the RF energy, the oxygen will not be ionized until the temperature is higher than 270° C., and such high temperature would increase the diffusion ability of copper in the first conductive layer 16. In contrast, by subjecting the oxygen to the RF energy, the treating process can be performed at lower temperatures, at least below 100° C. and even as low as room temperature.

FIG. 10 shows a profiling diagram of the barrier layer 50B after the treating process. Before the treating process, the metal nitride layer 34 has a column grain structure, which provides diffusion paths for copper atoms in the first conductive layer 16 through the grain boundary. It can be observed in FIG. 7 that oxygen atoms exist in the metal nitride layer 34, i.e., the metal nitride layer 34 with column grain structure is oxidized in the treating process. In other words, the grain boundary of the column grain structure in the metal nitride layer 34 is stuffed up by the oxygen atoms, and the barrier ability of the barrier layer 50B to the reciprocal diffusion of copper in the first conductive layer 16 and aluminum in the second conductive layer 52 is increased by the treating process. In addition to stuffing up the grain boundary of the column grain structure in the metal nitride layer 34, the treating process also forms the first metal oxide layer 36 and the second metal oxide layer 38 to serve as a portion of the barrier layer 50B. The first metal oxide layer 36 and the second metal oxide layer 38 do not have the grain boundary because they are not column structure, i.e., they are able to effectively prevent the reciprocal diffusion of copper in the first conductive layer 16 and aluminum in the second conductive layer 52.

In addition, it can be observed that the percentage of oxygen atoms in the metal nitride layer 34 in FIG. 10 is lower than the percentage of oxygen atoms in the metal nitride layer 24 in FIG. 6. This result is caused by the addition of hydrogen serving as a reductant in the treating process, and hydrogen helps to reduce the oxidation ability of oxygen serving as oxidant to the metal nitride layer 34. In other words, the oxidation ability of the treating process can be adjusted by tuning the ratio of oxygen to hydrogen according to the present invention. If no hydrogen is added to the gas, the processing conditions of the treating process such as the RF power, processing time and processing pressure have to be carefully controlled to prevent over-oxidation of the metal nitride layer 34 to generate too much metal oxide, which increases the resistance of the barrier layer 50B. In addition to carefully controlling the processing conditions, the present invention also provides a mechanism to prevent the occurrence of the over-oxidation by tuning the ratio of oxygen to hydrogen.

Although the present invention and its objectives have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for fabricating an integrated circuit barrier layer, comprising:
    forming a metal layer on a substrate;
    forming a metal nitride layer on the metal layer; and
    performing a treating process in an atmosphere including a plasma formed from a gas including oxidant to form a first metal oxide layer between the metal layer and the metal nitride layer, wherein the gas further includes a reductant.

2. The method for fabricating an integrated circuit barrier layer of claim 1, wherein the treating process is performed at a temperature below 100° C.

3. The method for fabricating an integrated circuit barrier layer of claim 1, wherein the plasma is created by subjecting the gas to RF energy between 1000 and 2000 Watt.

4. The method for fabricating an integrated circuit barrier layer of claim 1, wherein the treating process is performed in a reaction chamber with a pressure between 5 and 20 mTorr.

5. The method for fabricating an integrated circuit barrier layer of claim 1, wherein the oxidant is oxygen, the reductant is hydrogen, and the substrate is silicon wafer.

6. A method for fabricating an integrated circuit barrier layer, comprising:
    forming a metal nitride layer on a substrate; and
    performing a treating process in an atmosphere including a plasma formed from a gas including oxidant to form a metal oxide layer between the metal nitride layer and the substrate, wherein the gas further includes a reductant.

7. The method for fabricating an integrated circuit barrier layer of claim 6, wherein the treating process is performed at a temperature below 100° C.

8. The method for fabricating an integrated circuit barrier layer of claim 6, wherein the plasma is created by, subjecting the gas to RF energy between 1000 and 2000 Watt.

9. The method for fabricating an integrated circuit barrier layer of claim 6, wherein the treating process is performed inn reaction chamber with a pressure between 5 and 20 mTorr.

10. The method for fabricating an integrated circuit barrier layer of claim 6, wherein the oxidant is oxygen, the reductant is hydrogen, and the substrate is silicon wafer.

11. A method for fabricating an integrated circuit structure, comprising:
   forming a second dielectric layer on a substrate including a first conductive layer and a first dielectric layer;
   forming a hole exposing the first conductive layer in the second dielectric layer;
   forming a barrier layer inside the hole, the forming of the barrier layer including:
      forming a metal layer in the hole;
      forming a metal nitride layer on the metal layer; and
      performing a treating process in an atmosphere including a plasma formed from a gas including oxidant and a reductant to form a metal oxide layer between the metal layer and the metal nitride layer; and
   forming a second conductive layer on the barrier layer.

12. The method for fabricating an integrated circuit structure of claim 11, wherein the forming of the barrier layer comprising the steps of:
   forming a metal layer in the hole; and
   performing the treating process to form a metal oxide layer on the metal layer.

13. The method for fabricating an integrated circuit structure of claim 11, wherein the treating process is performed at a temperature below 100° C.

14. The method for fabricating an integrated circuit structure of claim 11, wherein the plasma is created by subjecting the gas to RF energy between 1000 and 2000 Watt.

15. The method for fabricating an integrated circuit structure of claim 11, wherein the treating process is performed in a reaction chamber with a pressure between 5 and 20 mTorr.

16. The method for fabricating an integrated circuit structure of claim 11, wherein the oxidant is oxygen, the reductant is hydrogen, and the substrate is silicon wafer.

17. A method for fabricating an integrated circuit barrier layer, comprising:
   forming a metal layer on a substrate;
   forming a metal nitride layer on the metal layer; and
   performing a treating process in an atmosphere including a plasma formed from a gas including oxidant to form a metal oxide layer between the metal layer and the metal nitride layer.

18. A method for fabricating an integrated circuit barrier layer, comprising:
   forming a metal nitride layer on a substrate; and
   performing a treating process in an atmosphere including a plasma formed from a gas including oxidant to form a metal oxide layer between the metal nitride layer and the substrate.

19. A method for fabricating an integrated circuit structure, comprising:
   forming a second dielectric layer on a substrate including a first conductive layer and a first dielectric layer;
   forming a hole exposing the first conductive layer in the second dielectric layer;
   forming a barrier layer inside the hole, the forming of the barrier layer including:
      forming a metal layer in the hole;
      forming a metal nitride layer on the metal layer; and
      performing a treating process in an atmosphere including a plasma formed from a gas including oxidant to form a metal oxide layer between the metal layer and the metal nitride layer; and
   forming a second conductive layer on the barrier layer.

* * * * *